United States Patent
Shangguan et al.

(10) Patent No.: US 10,863,617 B2
(45) Date of Patent: Dec. 8, 2020

(54) PRINTED CIRCUIT BOARD AND ELECTRONIC APPARATUS HAVING THE SAME

(71) Applicant: BOE TECHNOLOGY GROUP CO., LTD., Beijing (CN)

(72) Inventors: Xingchen Shangguan, Beijing (CN); Pan Li, Beijing (CN); Yongda Ma, Beijing (CN); Jian Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 273 days.

(21) Appl. No.: 15/517,072

(22) PCT Filed: Aug. 12, 2016

(86) PCT No.: PCT/CN2016/094984
§ 371 (c)(1),
(2) Date: Apr. 5, 2017

(87) PCT Pub. No.: WO2017/124733
PCT Pub. Date: Jul. 27, 2017

(65) Prior Publication Data
US 2017/0332484 A1    Nov. 16, 2017

(30) Foreign Application Priority Data

Jan. 21, 2016   (CN) .................... 2016 2 0061615 U

(51) Int. Cl.
*H05K 1/00* (2006.01)
*H05K 1/02* (2006.01)
*H05F 3/02* (2006.01)

(52) U.S. Cl.
CPC ............. *H05K 1/0254* (2013.01); *H05F 3/02* (2013.01); *H05K 1/0259* (2013.01); *H05K 1/0215* (2013.01); *H05K 2201/09063* (2013.01)

(58) Field of Classification Search
CPC .. H05K 1/0254; H05K 1/0259; H05K 1/0215; H05K 2201/09063; H05F 3/02
See application file for complete search history.

(56) References Cited

U.S. PATENT DOCUMENTS

| | | | | |
|---|---|---|---|---|
| 5,420,378 A | * | 5/1995 | Estes | .................... H05K 1/0215 174/261 |
| 6,295,210 B1 | * | 9/2001 | Lanzone | .............. H05K 1/0215 174/263 |

(Continued)

FOREIGN PATENT DOCUMENTS

| | | |
|---|---|---|
| CN | 1538797 A | 10/2004 |
| CN | 105263255 A | 1/2016 |
| CN | 205336651 U | 6/2016 |

OTHER PUBLICATIONS

International Search Report of PCT/CN2016/094984 in Chinese, dated Nov. 18, 2016 with English translation.

(Continued)

*Primary Examiner* — Pete T Lee
(74) *Attorney, Agent, or Firm* — Collard & Roe, P.C.

(57) ABSTRACT

A printed circuit board and an electronic apparatus having the printed circuit board are provided. The printed circuit board includes a circuit board body and an electronic element disposed on the circuit board body, the circuit board body is provided with a conductive hole, the circuit board body is grounded by a conductor provided in the conductive hole, and at least one through hole is disposed between the conductive hole and at least part of the electronic element.

17 Claims, 8 Drawing Sheets

(56) References Cited

U.S. PATENT DOCUMENTS

| | | | | |
|---|---|---|---|---|
| 6,486,414 B2* | 11/2002 | Kobayashi | ............ | H05K 1/0222 |
| | | | | 174/255 |
| 6,706,964 B2* | 3/2004 | Igarashi | ............... | H05K 1/0218 |
| | | | | 174/250 |
| 7,463,122 B2* | 12/2008 | Kushta | ...................... | H01P 3/06 |
| | | | | 333/260 |
| 8,766,099 B2* | 7/2014 | Yeates | .................. | H05K 1/0271 |
| | | | | 174/254 |
| 2009/0219703 A1* | 9/2009 | Ishii | ..................... | H05K 1/0215 |
| | | | | 361/753 |
| 2011/0141707 A1* | 6/2011 | Hasegawa | ............ | H05K 1/0215 |
| | | | | 361/753 |

OTHER PUBLICATIONS

Notice of Transmittal of the International Search Report of PCT/CN2016/094984 in Chinese, dated Nov. 18, 2016.

Written Opinion of the International Searching Authority of PCT/CN2016/094984 in Chinese, dated Nov. 18, 2016 with English translation.

* cited by examiner

US 10,863,617 B2

PRINTED CIRCUIT BOARD AND ELECTRONIC APPARATUS HAVING THE SAME

CROSS REFERENCE TO RELATED APPLICATIONS

This application is the National Stage of PCT/CN2016/094984 filed on Aug. 12, 2016, which claims priority under 35 U.S.C. § 119 of Chinese Application No. 201620061615.X filed on Jan. 21, 2016, the disclosure of which is incorporated by reference.

TECHNICAL FIELD

Embodiments of the present disclosure relate to a printed circuit board and an electronic apparatus having the printed circuit board.

BACKGROUND

At present, almost all electronic products cannot work without a printed circuit board, the printed circuit board serves as a carrier of electronic elements, and its quality is concerned with the quality of the whole electronic product. Electrostatic discharge of the printed circuit board is one of important factors that affects normal working of the printed circuit board, the electrostatic discharge means that static charges affecting working of the electronic elements on the printed circuit board are weakened or conducted away, for example, conducted to the ground, so as to reduce or avoid a poor influence of the static charges on the electronic elements on the printed circuit board as much as possible.

SUMMARY

According to embodiments of the disclosure, a printed circuit board is provided. The printed circuit board comprises a circuit board body and an electronic element disposed on the circuit board body. The circuit board body is provided with a conductive hole, and at least one through hole is disposed between the conductive hole and at least part of the electronic element.

According to the embodiments of the disclosure, an electronic apparatus is provided. The electronic apparatus comprises the above-described printed circuit board.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical or scientific terms used in the present application should be the general meaning understood by those having ordinal skills in the art. The terms "first", "second" and similar words used in the present disclosure do not represent any order, quantity or importance, and are merely intended to differentiate different constituting parts. "Comprising" or "containing" and other similar words mean that elements or objects in front of such words cover the elements or objects and their equivalents listed behind such words rather than excluding other elements or objects. "Connected" or "connection" and other similar words are not limited to physical or mechanical connection, but can comprise electric connection regardless of direct or indirect connection. "Upper", "lower", "left" and "right" are merely intended to represent a relative position relation, and the relation position relation may be correspondingly changed when an absolute position of a described object is changed.

In addition, in the description of the present disclosure, unless otherwise described, "a plurality of" means two or more.

The electronic elements provided by embodiments of the present disclosure are based on a direction or positional relationship as shown in the description or drawings, and, unless otherwise explained, are merely intended to describe a relative region of one or more electronic elements on a printed circuit board rather than representing a specific quantity or a specific position.

Electrostatic discharge of a current printed circuit board is achieved through a conductive hole in the printed circuit board, a conductive block (for example, a screw) in the conductive hole is electrically connected to the printed circuit board, and electrostatic charges in the printed circuit board is conducted to the conductive hole and then conducted to the ground by the conductive block. But a large number of electrostatic charges are gathered in the conductive hole so that a local voltage of the conductive hole is raised, this raised voltage may exceed a voltage resistance value of the electronic elements on the printed circuit board, and especially, the electronic elements are easily broken down when the amount of the electrostatic charges is overlarge.

Figure 1:
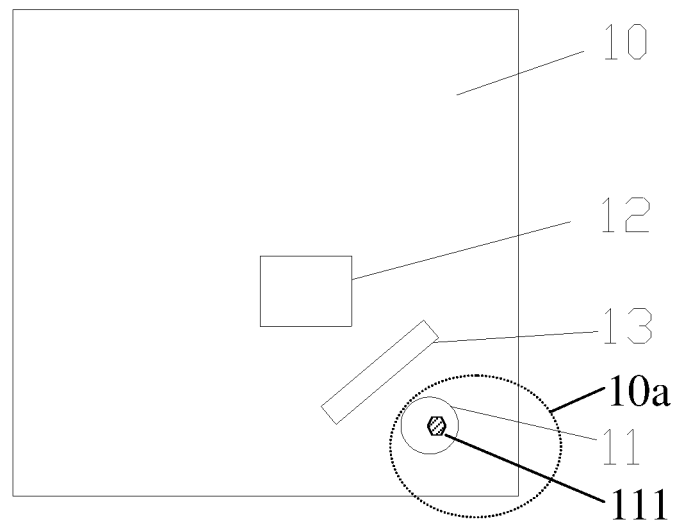
FIG. 1 is a structural view of a printed circuit board provided by embodiments of the present disclosure.

FIG. 1 shows a printed circuit board provided by at least one embodiment of the present disclosure; as shown in FIG. 1, the printed circuit board comprises a circuit board body 10 and an electronic element 12 disposed on the circuit board body 10; the circuit board body 10 is provided with a conductive hole 11, a conductor 111 electrically connected to the circuit board body 10 is disposed in the conductive hole 11, and the circuit board body 10 is grounded through the conductor 111 in the conductive hole 11 so as to conduct static charges out, for example, the circuit board body 10 is grounded through a screw (an example of the conductor 111) locked into the conductive hole 11; on the circuit board body 10, at least one through hole 13 is disposed between at least part of the electronic element 12 and the conductive hole 11, i.e., at least part of the electronic element 12 is located on one side of the through hole 13, and the conductive hole 11 is located on the other, opposite side of the through hole 13. Since the through hole 13 is located in a path where at least part of the electronic element 12 and the conductive hole 11 are linearly connected, (i.e., the through hole 13 is located on a connecting line between the electronic element 12 and the conductive hole 11), at least part of the electronic element 12 and the conductive hole 11 are separated by the through hole 13, thereby reducing or avoiding the static charges directly conducted to at least part of the electronic element 12 from the conductive hole 11.

Of course, the conductor 111 in the conductive hole 11 is not limited to the screw, and the conductor may be a conductive structure in any form that is electrically connected to the circuit board body 10 and is grounded.

For example, the electronic element 12 is a capacitor, a resistor, an IC (Integrated Circuit), a diode, a triode or similar elements easy to break down.

According to the embodiments of the present disclosure, the through hole is arranged in the path where the at least part of electronic element and the conductive hole are linearly connected (the through hole is an independent hole structure and is not used for electric connection between different parts, for example, no electronic element is arranged in such through hole); for example, in a direction perpendicular to the path where the electronic element 12 and the conductive hole 11 are linearly connected, the size of the through hole 13 is larger than or equal to the size of at least one of the electronic element 12 and the conductive hole 11. Therefore, the static charges directly conducted to the at least part of electronic element from the conductive hole are reduced or avoided, thereby reducing or avoiding the problem that the electronic element is broken down due to local electrostatic charge accumulation of the conductive hole when the amount of the electrostatic charges is overlarge.

Optionally, for example, the through hole 13 penetrates through the circuit board body 10; in this way, at least part of the electronic element 12 and the conductive hole 11 are separated more effectively, and the static charges directly conducted to at least part of the electronic element 12 from the conductive hole 11 are further reduced or avoided.

Optionally, for example, the conductive hole 11 is located at a boundary of the printed circuit board. For example, in the embodiments as shown in FIG. 1, the conductive hole 11a is located at a corner part 10a of the printed circuit board. In other embodiments, the conductive hole for example is located at a lateral side. The position of the conductive hole 11 is disposed according to actual needs, for example, the conductive hole 11 is disposed at multiple corners or lateral sides of the printed circuit board.

It is noted that the conductor (for example the screw) penetrates through the conductive hole 11 in at least one embodiment of the present disclosure and is further configured for fixing the printed circuit board. Therefore, preferably, the conductive hole 11 is located at the corner of the printed circuit board. In addition, the electronic element is disposed on the circuit board body according to the actual requirements, for example, the electronic element 12 is partially or wholly located on the surface of the circuit board boy 10, or the electronic element 12 is partially or wholly penetrates through the circuit board body 10, which is not limited herein.

In the embodiments as shown in FIG. 1, the through hole 13 is a linear through hole, it is noted that the shape, size and quantity of the through hole 13 can be changed according to actual needs, and are not limited by the embodiments of the present disclosure.

Optionally, for example, a distance between the through hole 13 and the conductive hole 11 is 1 cm to 6 cm; and/or a distance between at least part of the electronic element 12 and the conductive hole 11 is 1 cm to 6 cm. For example, a width of the through hole 13 is 0.3 cm to 3 cm.

Figure 2:
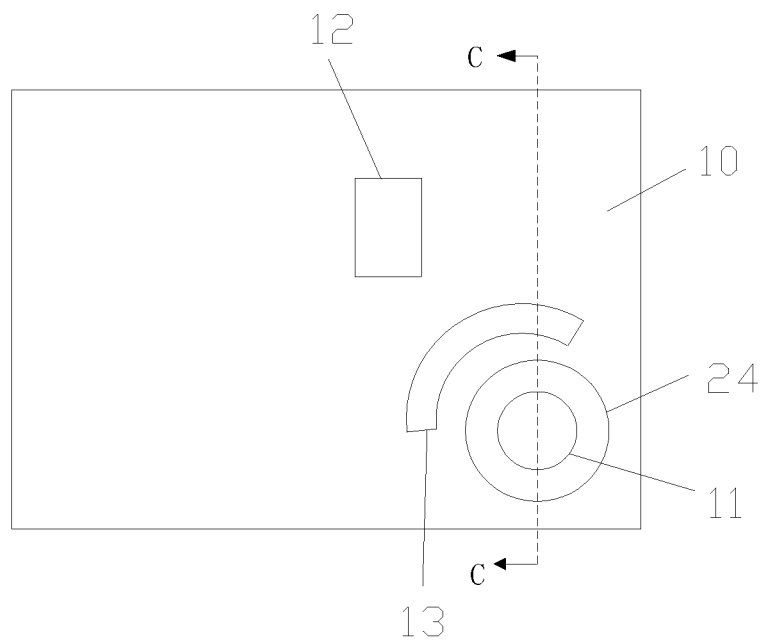
FIG. 2 is a structural view of another printed circuit board provided by the embodiments of the present disclosure.

FIG. 2 shows another printed circuit board provided by at least one embodiment of the present disclosure; as shown in FIG. 2, the structure of the printed circuit board as shown in FIG. 2 is basically same as that of the printed circuit board as shown in FIG. 1, and a difference lies in that in the printed circuit board as shown in FIG. 2, a conductive ring 24 is disposed around the conductive hole 11 on the circuit board body 10, a contact area between the printed circuit board and the conductor (not shown in the FIG. 2; for example, the conductor is the screw) is increased by disposing the conductive ring 24, such that a discharge speed of the static electricity is accelerated. In any embodiments of the present disclosure, for example, the conductive ring is a copper foil ring. Of course, the conductive ring 24 may be a conductive ring made of other conductive materials, for example, made of a metal material such as aluminum.

It is noted that the conductive ring 24 in the embodiments as shown in FIG. 2 is a complete ring around the conductive hole 11; in other embodiments, the conductive ring 24 for example is an arc, and the conductive ring 24 is disposed at least around part of the conductive hole 11.

In addition, in another embodiment, the through hole 13 is arc-shaped, the through hole 13 is disposed at least around part of the conductive hole 11. An angle of the arc-shaped through hole 13 for example is set according to a number of the electronic elements 12 near the conductive hole 11; in the case that the number of the electronic elements 12 is more, then the angle of the arc-shaped through hole 13 is set to be larger to separate as much as possible electronic elements 12 near the conductive hole 11; otherwise, the angle of the arc-shaped through hole 13 is set to be smaller to increase a mechanical strength of the printed circuit board. The angle of the arc-shaped through hole 13 refers to an included angle formed by two connecting lines between two end parts of the arc-shaped through hole 13 and a center of the conductive hole 11. For example, the angle of the arc-shaped through hole 13 is 30°-250°.

Figure 3:
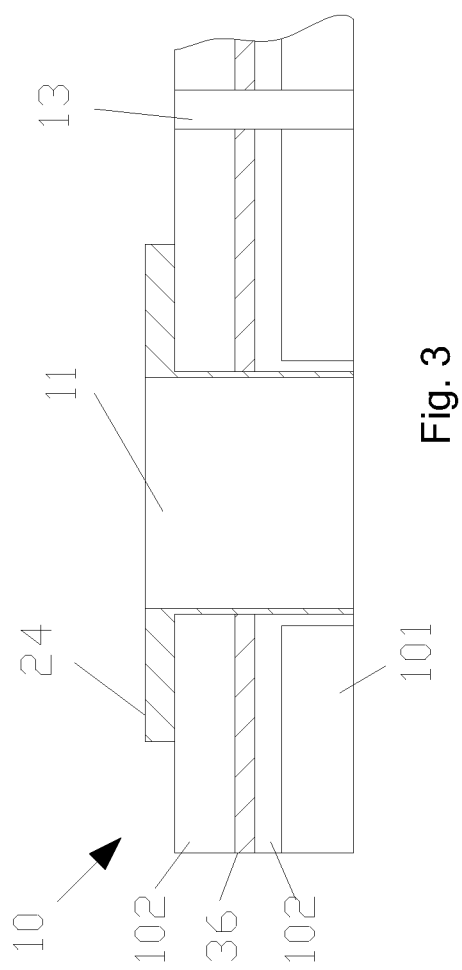
FIG. 3 is a sectional schematic view of a part of the printed circuit board taken along a C-C line as shown in FIG. 2.

FIG. 3 is a sectional view of the printed circuit board as shown in FIG. 2 taken along a C-C direction; as shown in FIG. 3, the circuit board body 10 further includes a grounding layer 36, the grounding layer 36 is electrically connected to the conductor disposed in the conductive hole 11, and therefore, a discharge speed of the static electricity is accelerated. For example, the grounding layer 36 is electrically connected to the conductor through an inner wall of the conductive hole 11 and the conductive ring 24, and a contact area between the grounding layer 36 and the conductor (for example, the screw) is increased by the conductive ring 24, such that the discharge speed of the static electricity is accelerated.

It is noted that the circuit board body 10 provided by the embodiments of the present disclosure for example further includes one or more of a substrate 101, an insulating layer 102 and a reflective layer (not shown). The substrate 101 for example is made of a conductive material, for example, copper or aluminum, and is used for heat dissipation of the printed circuit board. The insulating layer 102 for example covers the substrate 101, for example, is an inorganic oxide layer or organic insulating film, further for example, is an oxide layer or a resin insulating layer, and is used for avoiding electrical connection between an electrical circuit on the printed circuit board and the substrate 101, meanwhile the insulating layer 102 has better heat conductivity to conduct heat generated by the electrical circuit to the substrate 101. The reflective layer is a metal reflective layer, a totally dielectric reflective layer or other reflective structures made of other materials. Of course, the structure of the circuit board body 10 shown in FIG. 3 may be adapted to other embodiments, the structure of the circuit board body 10 provided by other embodiments of the present disclosure may be same as or different from the structure of the circuit board body 10 shown in FIG. 3.

It is noted that the position of the grounding layer 36 of the embodiments of the present disclosure is disposed as required, and is not limited to be provided on a side of the substrate 101 of the printed circuit board body facing the electronic element. For example, the grounding layer 36 is located on a side of the substrate 101 of the printed circuit board body 10 facing away from the electronic element. The structure of the grounding layer 36 provided by other embodiments of the present disclosure may be same as or different from the structure of the grounding layer 36 shown in FIG. 3.

Figure 4:
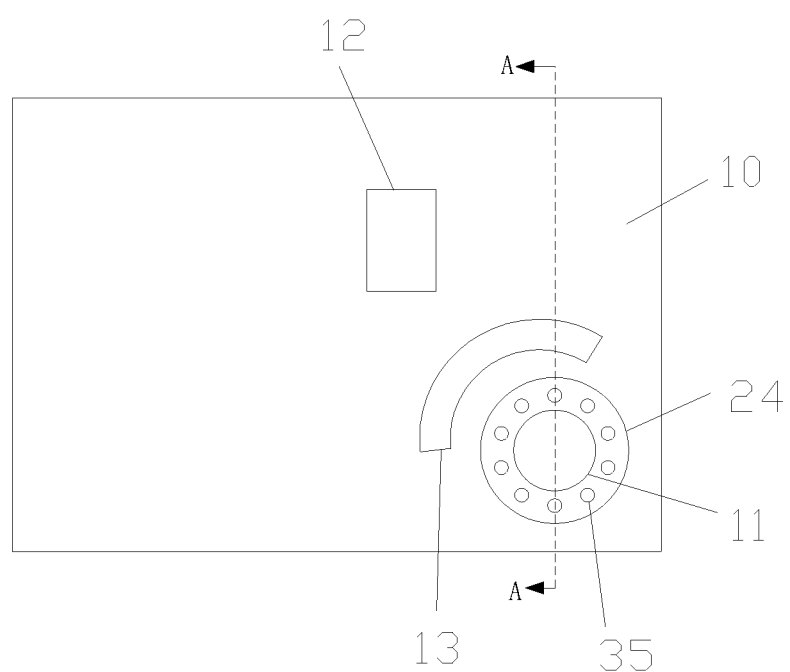
FIG. 4 is a structural view of a further printed circuit board provided by the embodiments of the present disclosure.

FIG. 4 shows another printed circuit board provided by at least one embodiment of the present disclosure, the structure of the printed circuit board as shown in FIG. 4 is basically same as the structure of the printed circuit board as shown in FIG. 2, a difference at least lies in that a plurality of via holes 35 with a same diameter are disposed in the circuit board body 10 of the printed circuit board, and the via holes 35 are disposed around the conductive hole 11 at intervals and are located in the conductive ring 24.

Figure 5:
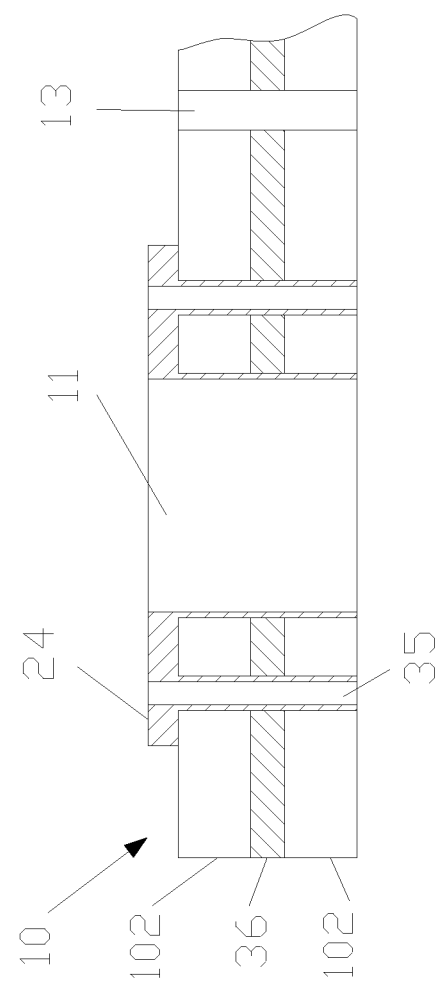
FIG. 5 is a sectional schematic view of a part of the printed circuit board taken along an A-A line as shown in FIG. 4.

FIG. 5 is a sectional view of the printed circuit board shown in FIG. 4 taken along an A-A direction; as shown in FIG. 5, the contact area between the circuit board body 10 and the conductor (for example the screw) is increased by the conductive ring 24, a discharge speed of the static electricity is accelerated, the grounding layer 36 and the conductive ring 24 are electrically connected through the via holes 35, the contact area between the grounding layer 36 and the conductor (for example the screw) is increased by the conductive ring 24, and therefore, the discharge speed of the static electricity is further accelerated.

It is noted that FIG. 5 does not show the substrate and the reflective layer of the printed circuit board.

Figure 6:
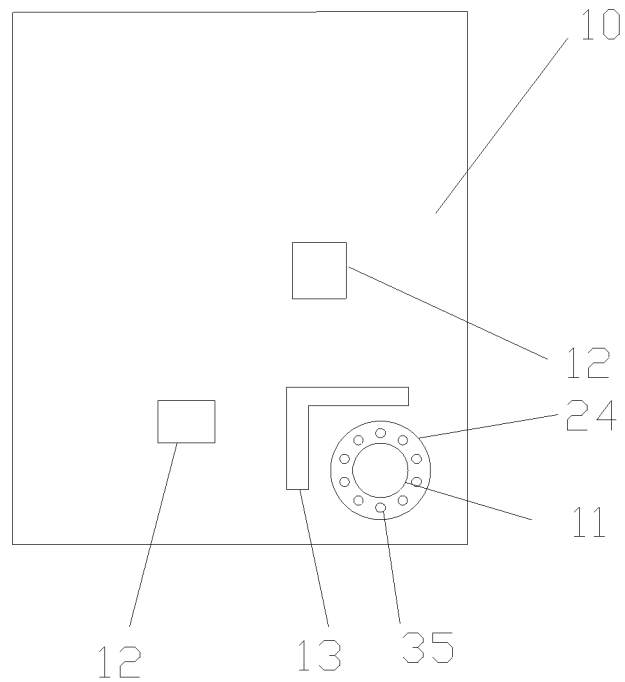
FIG. 6 is a structural view of another printed circuit board provided by the embodiments of the present disclosure.

FIG. 6 shows another printed circuit board provided by at least embodiment of the present disclosure; the structure of the printed circuit board as shown in FIG. 6 is basically same as that of the printed circuit board as shown in FIG. 4, and a difference at least lies in that the through hole 13 of the printed circuit board as shown in FIG. 6 is in a folded line shape. In the embodiments as shown in FIG. 6, the through hole 13 for example is formed by connecting two sections perpendicular to each other, and two parts of electronic elements 12 are separated from the conductive hole 11 by the folded line-shaped through hole 13. The two parts of electronic elements 12 for example are electrically connected or disconnected. Of course, functions of the two parts of electronic elements may be same or different.

In other implementing modes, the folded line-shaped through hole 13 for example comprises two linear sections that are unconnected with each other.

Figure 7:
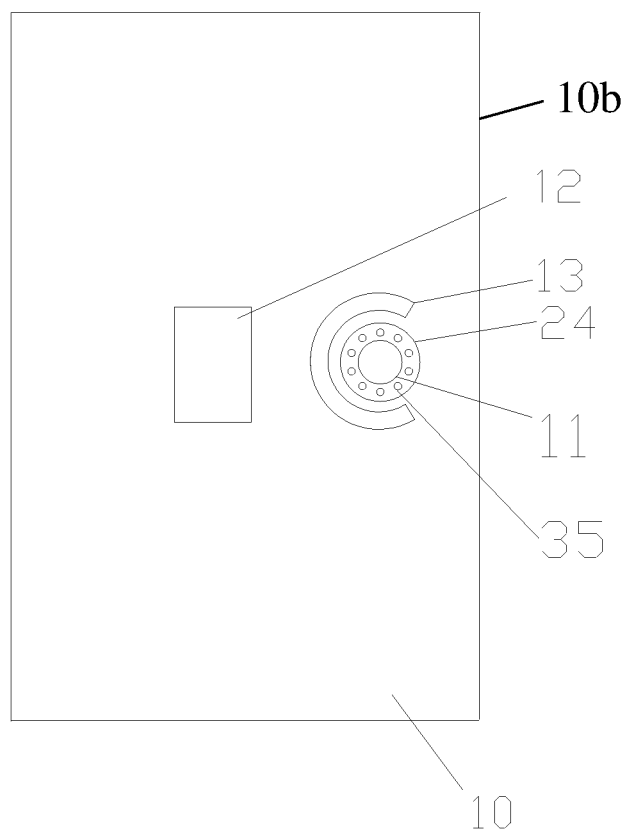
FIG. 7 is a structural view of another printed circuit board provided by the embodiments of the present disclosure.

FIG. 7 shows another printed circuit board provided by at least one embodiment of the present disclosure, the structure of the printed circuit board as shown in FIG. 7 is basically same as that of the printed circuit board as shown in FIG. 4, and a difference at least lies in that the conductive hole 11 of the printed circuit board as shown in FIG. 7 is located at a lateral side 10b of the circuit board body 10, and correspondingly, the position of the through hole 13 is adjusted along with the conductive hole 11.

Figure 8:
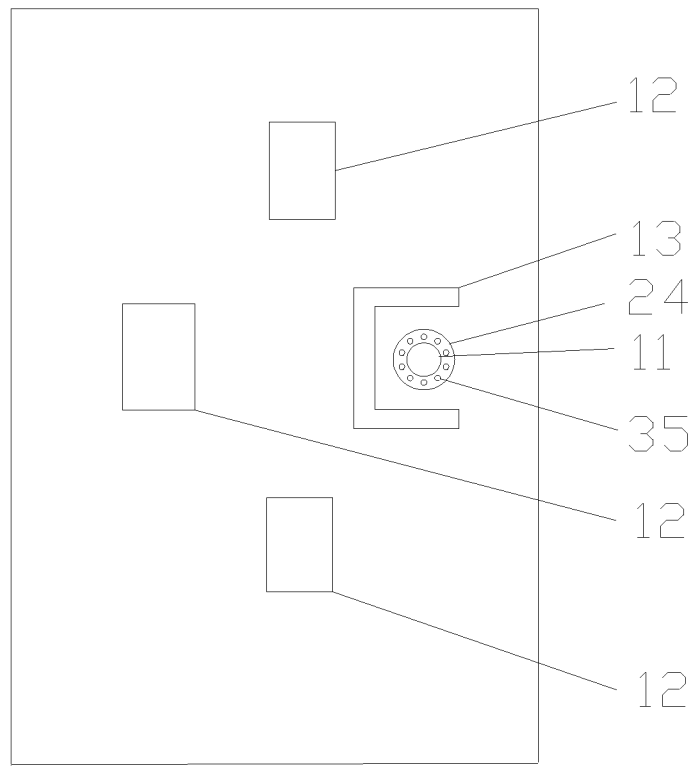
FIG. 8 is a structural view of another printed circuit board provided by the embodiments of the present disclosure.

FIG. 8 shows another printed circuit board provided by at least one embodiment of the present disclosure; the structure of the printed circuit board as shown in FIG. 8 is basically same as that of the printed circuit board as shown in FIG. 7, and a difference at least lies in that the through hole 13 of the printed circuit board as shown in FIG. 8 is in a tri-section folded line shape (that is, the through hole 13 is of folded line shape and has three sections), the through hole 13 separates the conductive through hole 11 from three electronic elements 12 nearby the conductive through hole 11. In the case that there are more electronic elements 12 near the conductive hole 11, the tri-section folded line-shaped through hole 13 better separates the electronic elements 12 from the conductive hole 11 compared with the linear through hole 13.

Figure 9:
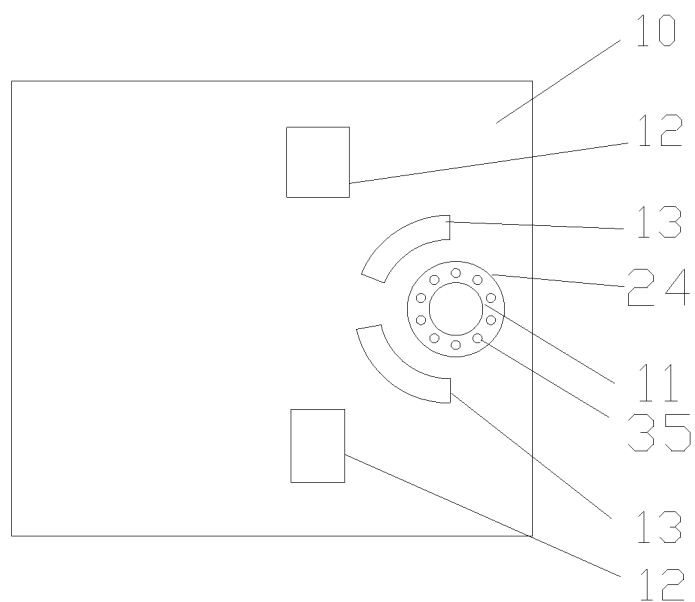
FIG. 9 is a structural view of another printed circuit board provided by the embodiments of the present disclosure.

FIG. 9 shows another printed circuit board provided by at least one embodiment of the present disclosure, the structure of the printed circuit board as shown in FIG. 9 is basically same as that of the printed circuit board as shown in FIG. 7, and a difference at least lies in that two unconnected arc-shaped through holes 13 are disposed nearby the conductive hole 11 in the printed circuit board. In the present embodiment, since there are two electronic elements nearby the conductive hole 11 and the electronic elements are located in different directions, the two unconnected arc-shaped through holes 13 are disposed nearby the conductive hole 11. In this way, not only a discharge path of the static electricity on the printed circuit board is changed, but also a mechanical strength of the printed circuit board is increased.

Figure 10:
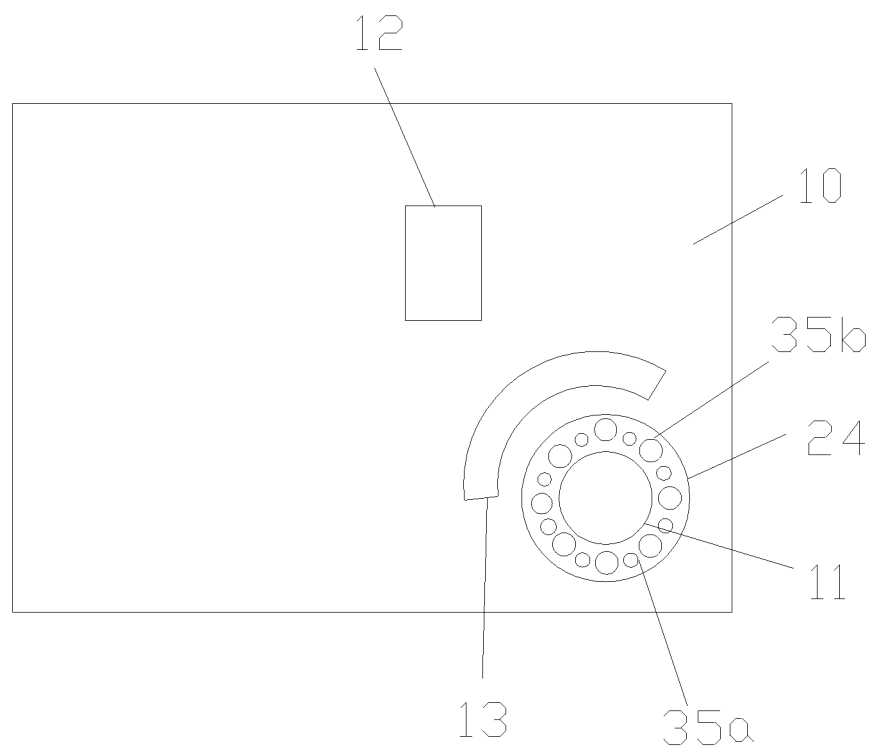
FIG. 10 is a structural view of a further printed circuit board provided by the embodiments of the present disclosure

FIG. 10 shows another printed circuit board provided by at least one embodiment of the present disclosure; the structure of the printed circuit board as shown in FIG. 10 is basically same as that of the printed circuit board as shown in FIG. 4, and a difference at least lies in that the via holes 35 provided in the printed circuit board as shown in FIG. 10 include a plurality of first via holes 35a and a plurality of second via holes 35b which are alternately disposed around the conductive hole 11, and a diameter of the first via hole 35a is different from a diameter of the second via hole 35b. By alternately disposing the first via holes 35a and the second via holes 35b with the different diameters, a contact area between the grounding layer 36 and the conductive ring 24 is increased as much as possible while ensuring a mechanical strength of the printed circuit board, and therefore, a discharge speed of the static electricity is accelerated.

For example, the number of the via holes 35 is 4-20, for example, 16 via holes are shown in FIG. 10. The number of the via holes is set to 4-20, so as to ensure that the printed circuit board has a better mechanical strength.

Figure 11:
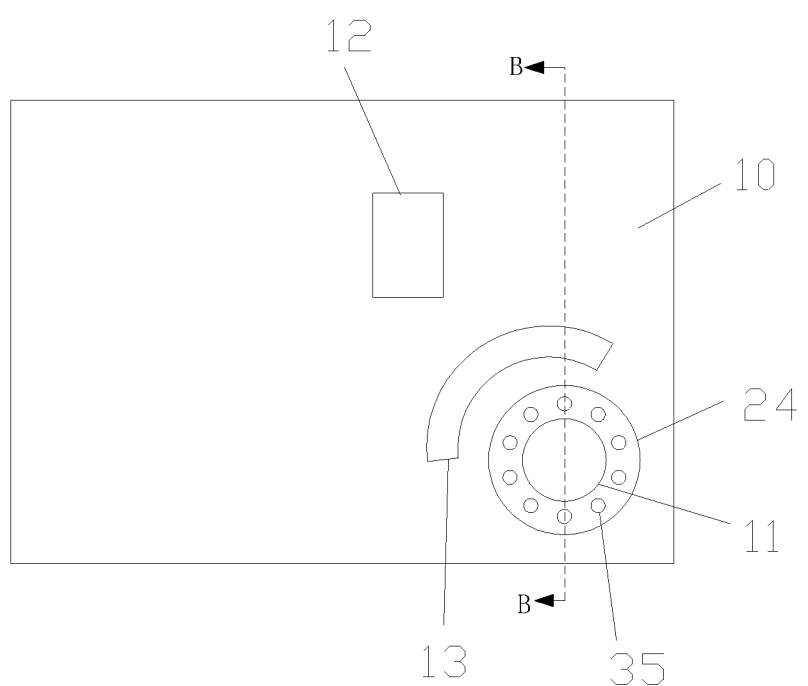
FIG. 11 is a structural view of yet another printed circuit board provided by the embodiments of the present disclosure.
Figure 12:
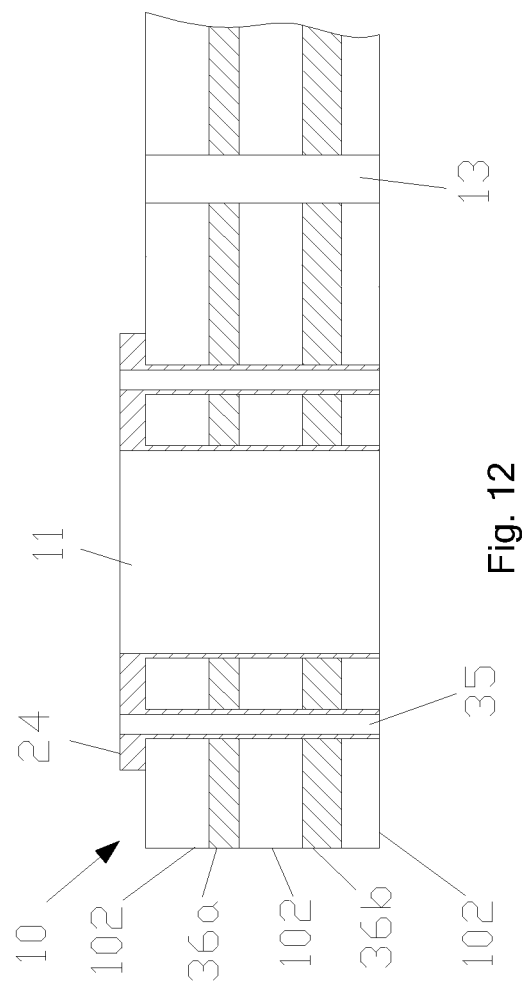
FIG. 12 is a sectional schematic view of a part of the printed circuit board taken along a B-B line as shown in FIG. 11.

FIG. 11 shows another printed circuit board provided by at least one embodiment of the present disclosure, FIG. 12 is a sectional view of the printed circuit board as shown in FIG. 11 taken along a B-B position in the drawing, the structure of the printed circuit board as shown in FIGS. 11 and 12 is basically same as the structure of the printed circuit board as shown in FIG. 4; as shown in FIG. 12, the difference at least lies in that the circuit board body 10 of the printed circuit board as shown in FIG. 11 includes two grounding layers 36a and 36b, which are for example separated by an insulating layer 102, the through hole 13 penetrates through both of the grounding layers 36a and 36b, the grounding layer 36a and the grounding layer 36b are both electrically connected to the conductor (for example, the screw) disposed in the conductive hole 11, meanwhile the grounding layers 36a and 36b are electrically connected to the conductive ring 24 through the via holes 35 distributed in the conductive ring 24, a contact area between the grounding layer 36 and the conductor (for example, the screw) is indirectly increased, and therefore, a discharge speed of the static electricity is further accelerated.

It is noted that the embodiment as shown in FIG. 12 contains two grounding layers, and more grounding layers may be provided in other embodiments, which is not limited by the embodiments of the present disclosure.

It is noted that a combining relationship of the through holes 13, the via holes 35 and the conductive ring 24 involved in the embodiments of the present disclosure is not limited to the embodiment as shown in FIG. 12.

It is noted that a specific shape, number and size of the through holes 13 can be set according to a positional relationship between the electronic elements 12 and the conductive hole 11. For example, in the embodiment as shown in FIG. 1, only one electronic element 12 exists nearby the conductive hole 11, and therefore, only one linear through hole 13 is disposed between the conductive hole 11 and the electronic element 12; for example, in the embodiment as shown in FIG. 5, there are two electronic elements 12 nearby the conductive hole 11, and therefore, the folded line-shaped through hole 13 is disposed. The electronic elements 12 and the conductive hole 11 are separated by the through hole 13 while an influence of the through hole 13 on a mechanical strength of the printed circuit board is also considered to avoid an influence on mounting of the printed circuit board.

It is noted that in the printed circuit board as shown in FIGS. 4-12, the via holes 35 are all distributed in the conductive ring 24; in other embodiments, the via holes 35 may be located outside the conductive ring 24, or part of the via holes 35 are located in the conductive ring 24 and part of the via holes 35 are located outside the conductive ring 24. In addition, in the embodiments of the present disclosure, the inner walls of the via holes 35 have a conductive material to electrically connect the grounding layer 36 to the conductive ring 24. For example, the inner walls of the through holes 13 have a conductive material that plays a role of attracting charges to the through hole, such that the charges are not diffused to the electronic element 12.

It is noted that in the printed circuit board as shown in FIGS. 1-12, as an example, only the electronic elements located nearby the conductive hole 11 are shown, and the electronic elements in other positions of the printed circuit board are not shown.

It is noted that FIGS. 5 and 12 do not show the substrate 101 and reflective layer of the printed circuit board.

The embodiments of the present disclosure further provide an electronic apparatus that includes any printed circuit board as shown in FIGS. 1-12.

According to the embodiments of the present disclosure, by disposing the through hole penetrating through the printed circuit board in the path where at least part of the electronic element and the conductive hole are linearly connected, the static charges directly conducted to the at least part of electronic element from the conductive hole are reduced or avoided, thereby avoiding the problem that the electronic element is broken down due to local electrostatic charge accumulation of the conductive hole when the amount of the electrostatic charges is overlarge.

For example, the electronic apparatus is a display device, which for example is a liquid crystal display device, an organic electroluminescence display device, an electronic paper, etc.

It is noted that the electronic apparatus may be any other electronic apparatus that is suitable for mounting any printed circuit board as shown in FIGS. 1-12.

In the printed circuit board and the electronic apparatus having such printed circuit board provided by the embodiments of the present disclosure, by disposing the through hole penetrating through the printed circuit board between the at least part of electronic element and the conductive hole, the at least part of electronic element and the conductive hole are separated, the static charges directly conducted to the at least part of electronic element from the conductive hole are reduced or avoided, thereby avoiding the problem that the electronic element is broken down due to local electrostatic charge accumulation of the conductive hole when the amount of the electrostatic charges is overlarge.

The foregoing embodiments merely are exemplary embodiments of the disclosure, and not intended to define the scope of the disclosure, and the scope of the disclosure is determined by the appended claims.

The application claims priority of Chinese Patent Application No. 201620061615.X filed on Jan. 21, 2016, the disclosure of which is incorporated herein by reference in its entirety as part of the present application.

The invention claimed is:

1. A printed circuit board, comprising a circuit board body and an electronic element disposed on the circuit board body, wherein the circuit board body is provided with a conductive hole, and at least one through hole is disposed between the conductive hole and at least part of the electronic element, the conductive hole and the at least one through hole extend from one of two opposite surfaces of the circuit board body to the other of the two opposite surfaces of the circuit board body;

the circuit board body includes: a conductive substrate, provided on a side of the circuit board body facing away from the electronic element and serving as an outermost layer of the circuit board body in a direction perpendicular to the circuit board body; a first insulating layer comprising a first portion stacked on the conductive substrate in the direction perpendicular to the circuit board body; a second insulating layer stacked on the first portion of the first insulating layer in the direction perpendicular to the circuit board body; and a grounding layer, stacked on the conductive substrate, located between the two opposite surfaces of the circuit board body and further provided between the first portion of the first insulating layer and the second insulating layer in the direction perpendicular to the circuit board body;

the first insulating layer further comprises a second portion, the second portion is connected with the first portion, the second portion extends in the direction perpendicular to the circuit board body while the first portion extends in a direction parallel to the circuit board body;

the second portion is provided between the conductive hole and the conductive substrate in the direction parallel to the circuit board body to cover and directly contact a side surface, which faces the conductive hole, of the conductive substrate, and the first portion is provided between the conductive substrate and the grounding layer in the direction perpendicular to the circuit board body to cover and directly contact an upper surface, which faces the grounding layer, of the conductive substrate, so that the conductive substrate is insulated from each of the conductive hole and the grounding layer; and the grounding layer is electrically connected with the conductive hole.

2. The printed circuit board according to claim 1, wherein the through hole is in a straight line shape, an arc shape or a folded line shape.

3. The printed circuit board according to claim 1, wherein the conductive hole is located at a lateral side or a corner part of the circuit board body.

4. The printed circuit board according to claim 1, wherein the through hole is disposed at least around part of the conductive hole.

5. The printed circuit board according to claim 1, wherein a distance between the through hole and the conductive hole is 1 cm to 6 cm;
   and/or a distance between at least part of the electronic element and the conductive hole is 1 cm to 6 cm.

6. The printed circuit board according to claim 1, wherein the circuit board body is provided with a conductive ring, and the conductive ring is disposed at least around part of the conductive hole.

7. The printed circuit board according to claim 1, wherein the circuit board body is provided with a plurality of via holes extending from one of the two opposite surfaces of the circuit board body to the other of the two opposite surfaces of the circuit board body, and the via holes are disposed around the conductive hole at intervals.

8. The printed circuit board according to claim 7, wherein a conductive ring is disposed around the conductive hole, and the via holes are distributed in the conductive ring.

9. The printed circuit board according to claim 7, wherein the plurality of via holes include a plurality of first via holes and a plurality of second via holes, the first via holes and the second via holes are alternately disposed around the conductive hole, and a diameter of the first via hole is different from a diameter of the second via hole.

10. The printed circuit board according to claim 7, wherein the plurality of via holes have a same diameter.

11. The printed circuit board according to claim 7, wherein a number of the via holes is 4 to 20.

12. The printed circuit board according to claim 1, wherein a conductor is disposed in the conductive hole, and the grounding layer is electrically connected to the conductor disposed in the conductive hole.

13. The printed circuit board according to claim 12, wherein the conductor is a screw.

14. An electronic apparatus, comprising the printed circuit board according to claim 1.

15. The electronic apparatus according to claim 14, wherein the electronic apparatus is a display device.

16. The printed circuit board according to claim 1, wherein a conductor is disposed in the conductive hole, and the conductor is electrically connected to the circuit board body by the conductive hole.

17. A printed circuit board, comprising a circuit board body and an electronic element disposed on the circuit board body, wherein the circuit board body is provided with a conductive hole, and at least one through hole is disposed between the conductive hole and at least part of the electronic element, the conductive hole and the at least one through hole extend from one of two opposite surfaces of the circuit board body to the other of the two opposite surfaces of the circuit board body;

the circuit board body includes: a conductive substrate, provided on a side of the circuit board body facing away from the electronic element and serving as an outermost layer of the circuit board body in a direction perpendicular to the circuit board body; a first insulating layer comprising a first portion stacked on the conductive substrate in the direction perpendicular to the circuit board body; a second insulating layer stacked on the first portion of the first insulating layer in the direction perpendicular to the circuit board body; a third insulating layer stacked on the second insulating layer in the direction perpendicular to the circuit board body; a first grounding layer, stacked on the conductive substrate, located between the two opposite surfaces of the circuit board body and further provided between the first portion of the first insulating layer and the second insulating layer in the direction perpendicular to the circuit board body; and a second grounding layer, stacked on the conductive substrate, located between the two opposite surfaces of the circuit board body and further provided between the second insulating layer and the third insulating layer in the direction perpendicular to the circuit board body;

the first insulating layer further comprises a second portion, the second portion is connected with the first portion, the second portion extends in the direction perpendicular to the circuit board body while the first portion extends in a direction parallel to the circuit board body;

the second portion is provided between the conductive hole and the conductive substrate in the direction parallel to the circuit board body to cover and directly contact a side surface, which faces the conductive hole, of the conductive substrate, and the first portion is provided between the conductive substrate and the first grounding layer in the direction perpendicular to the circuit board body to cover and directly contact an upper surface, which faces the first grounding layer, of the conductive substrate, so that the conductive substrate is insulated from each of the conductive hole and the first grounding layer; and the first grounding layer and the second grounding layer are electrically connected with the conductive hole.

* * * * *